US009355194B2

(12) United States Patent
Howerton et al.

(10) Patent No.: US 9,355,194 B2
(45) Date of Patent: May 31, 2016

(54) GRAPHICAL ACOUSTIC LINER DESIGN AND ANALYSIS TOOL

(71) Applicant: The United States of America as represented by the Administrator of the National Aeronautics and Space Administration, Washington, DC (US)

(72) Inventors: Brian M. Howerton, Newport News, VA (US); Michael G. Jones, Newport News, VA (US)

(73) Assignee: THE UNITED STATES OF AMERICA AS REPRESENTED BY THE ADMINISTRATOR OF THE NATIONAL AERONAUTICS AND SPACE ADMINISTRATION, Washington, DC (US)

( * ) Notice: Subject to any disclaimer, the term of this patent is extended or adjusted under 35 U.S.C. 154(b) by 620 days.

(21) Appl. No.: 13/771,116

(22) Filed: Feb. 20, 2013

(65) Prior Publication Data

US 2015/0253911 A1    Sep. 10, 2015

Related U.S. Application Data

(60) Provisional application No. 61/655,108, filed on Jun. 4, 2012.

(51) Int. Cl.
  *G09G 5/00*    (2006.01)
  *G06F 17/50*   (2006.01)
  *G01H 15/00*   (2006.01)
  *G10K 11/162*  (2006.01)

(52) U.S. Cl.
  CPC ............... *G06F 17/50* (2013.01); *G01H 15/00* (2013.01); *G10K 11/162* (2013.01)

(58) Field of Classification Search
  None
  See application file for complete search history.

(56) References Cited

U.S. PATENT DOCUMENTS

| 4,100,993 | A  | * | 7/1978  | Feder   | G10K 11/172 181/213 |
| 6,256,600 | B1 | * | 7/2001  | Bolton  | G10K 11/162 703/1 |
| 2002/0138237 | A1 | * | 9/2002  | Topholm | G06F 17/50 703/1 |
| 2007/0136309 | A1 | * | 6/2007  | Akinaga | G06Q 30/02 |
| 2007/0265727 | A1 | * | 11/2007 | Bae     | G06F 17/50 700/182 |
| 2008/0027684 | A1 | * | 1/2008  | Inzinga | G06F 17/5004 703/1 |

OTHER PUBLICATIONS

Parrott, T. L., et al., "Parallel-element Liner Impedances for Improved Absorption of Broadband Sound in Ducts," J Noise Control Engineering Journal; 1995, pp. 183-195, vol. 43, No. 6.
Howerton, B. M., et al., "Evaluation of Parallel-Element, Variable-Impedance, Broadband Acoustic Liner Concepts," 18th AIAA/CEAS Aeroacoustics Conference, Jun. 4-6, 2012, pp. 1-17, Colorado Springs, CO.

(Continued)

*Primary Examiner* — Kathy Wang-Hurst
*Assistant Examiner* — Matthew Yeung
(74) *Attorney, Agent, or Firm* — Andrea Z. Warmbier

(57) ABSTRACT

An interactive liner design and impedance modeling tool comprises software utilized to design acoustic liners for use in constrained spaces, both regularly and irregularly shaped. A graphical user interface allows the acoustic channel geometry to be drawn in a liner volume while the surface impedance calculations are updated and displayed in real-time. A one-dimensional transmission line model may be used as the basis for the impedance calculations.

18 Claims, 3 Drawing Sheets

(56) References Cited

OTHER PUBLICATIONS

Howerton, B. M., et al., "Development and Validation of an Interactive Liner Design and Impedance Modeling Tool," 18th AIAA/CEAS Aeroacoustics Conference, Jun. 4-6, 2012, pp. 1-19, Colorado Springs, CO.

Howerton, B. M., et al., "Validation of an Acoustic Impedance Prediction Model for Skewed Resonators," 15th AIAA/CEAS Aeroacoustics Conference, May 11-13, 2009, pp. 1-21, Miami, FL.

* cited by examiner

GRAPHICAL ACOUSTIC LINER DESIGN AND ANALYSIS TOOL

CROSS-REFERENCE TO RELATED APPLICATIONS

The present application claims the benefit of and priority to U.S. Provisional Application No. 61/655,108, filed on Jun. 4, 2012, the contents of which are hereby incorporated herein by reference.

STATEMENT REGARDING FEDERALLY SPONSORED RESEARCH OR DEVELOPMENT

The invention described herein was made by employees of the United States Government and may be manufactured and used by or for the Government of the United States of America for governmental purposes without the payment of any royalties thereon or therefore.

BACKGROUND OF THE INVENTION

Turbofan engines are a dominant contributor to overall aircraft noise. Reduction of the turbofan engine noise is therefore critical for aircraft compliance with current and future noise regulations. Fan noise comprises a large component of the overall turbofan engine noise.

The continuing push towards lower thrust-specific fuel consumption implies increased by-pass ratios (BPR>6) with greater fan diameters, fan chord lengths, and consequently, lower fan rotational speeds. Fan blade design and contouring, through the use of lean and sweep, have been employed to modify the acoustic characteristics of the engine. These trends lead to a further shift of the fan noise spectrum to lower frequencies, accompanied by increased broadband noise as a significant contributor to the aircrafts community noise impact. Airframe drag reduction considerations imply engine nacelles that are shorter relative to their diameter, thus limiting lined-duct-treatment-to-diameter ratio. This trend, along with limitations on nacelle wall thickness, inhibits liner effectiveness since a deeper liner would typically be required to mitigate lower frequency noise.

Fan noise has traditionally been alleviated by a combination of passive liner treatments and nacelle modifications. Known passive liners may include a honeycomb core bonded between a porous face sheet and an impervious backing plate. This configuration produces an array of independent, one-dimensional, tuned waveguides that behave as local-reacting absorbers. The acoustic absorption spectra of such structures are characterized by a single peak at the system resonance frequency and its odd harmonics with significantly reduced absorption at other frequencies.

Single-layer perforate-over-honeycomb liners may be used for absorption of individual fan tone frequencies and their harmonics. Extension to include broadband sound absorption is generally achieved via multi-layer acoustic liners (generally 2, but sometimes 3 layers) and/or variable depth. These designs are driven by the fidelity of the prediction tools, as well as geometric constraints, including 1-D impedance prediction tools based on a transmission line approach and 2-D drawing software (e.g. Corel Draw®, MS Paint®, SmartDraw®, etc).

Typical approaches to liner design have focused on narrowband attenuation spectra and are generally not broadband in character. Liners were developed to have constant depth which simplified the analysis. Creating a broadband liner design consisted of developing a liner geometry based on various acoustic rules and generally accepted practices then analyzing them with traditional command line style computer codes. The lack of integration between liner geometry design and analysis greatly increased the time to complete an iteration loop making such designs tedious.

SUMMARY OF THE INVENTION

One aspect of the present invention is an Interactive Liner Impedance Analysis and Design (ILIAD) tool comprising a software package that may be used to design the composite surface impedance of an acoustic liner using resonant channels. The software package preferably includes a graphical user interface that allows the acoustic channel geometry to be drawn in the liner volume while the surface impedance and absorption coefficient calculations are updated in real-time. A one-dimensional transmission line model serves as the basis for the impedance calculation. The one-dimensional transmission line model can be applied to many liner configurations. The software can be used to design arrays of resonators that can be packaged into complex geometries.

The software tool of the present invention alleviates the difficult task of generating aircraft liner designs that offer broadband sound absorption in spaces previously unused for liners due to the geometric complexities of the available space. Working liner design from a graphical standpoint allows the designer to visualize the spatial relationship between the liner channels and the design space. Real-time analysis provides instant feedback on changes to the liner geometry, thereby allowing liners to be designed to meet a specific surface impedance target spectra.

One aspect of the present invention is a method of designing acoustic liners. The method includes utilizing code to form an image on a display screen representing an acoustic liner. The image includes at least one resonator channel having a channel geometry and an opening. The method further includes utilizing code to translate the drawing data into input data that can be utilized by prediction code to calculate predicted acoustic impedance and absorption by the at least one resonator channel. The method further includes providing prediction code that utilizes input data concerning the channel geometry to calculate predicted acoustic impedance and absorption of noise incident on the opening of the resonator channel at a plurality of frequencies of the noise. The prediction code calculates output data concerning predicted acoustic impedance and absorption of noise by the resonator channel. Output data from the prediction code is utilized to generate an image on a display screen representing at least one of a predicted acoustic absorption of noise and a predicted acoustic impedance by the acoustic liner. The code may be configured to automatically recalculate output data concerning predicted acoustic impedance and absorption as the image of the resonator channel is changed.

DETAILED DESCRIPTION OF THE INVENTION

It will be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

One aspect of the present invention is a software tool or code that includes an impedance prediction component and a graphical user interface that allows a user to draw a two dimensional representation of a liner on a display screen. As discussed in more detail below, the code automatically recalculates impedance predictions as the geometry of the liner is changed by the user. A graph on the screen showing impedance predictions is also automatically updated as the liner geometry is changed. Thus, a user can immediately see the changes in predicted impedance as the liner geometry is changed.

Figure 1:
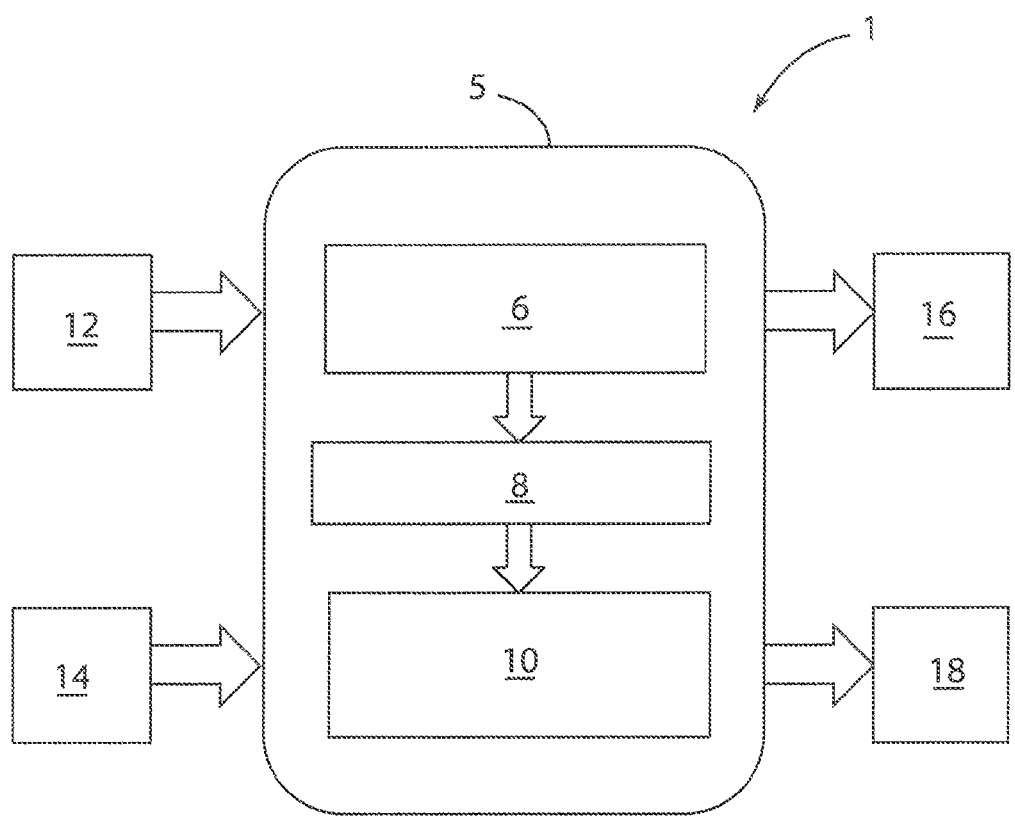
FIG. 1 is a schematic representation of a software program according to one aspect of the present invention.

With reference to FIG. 1 the graphical acoustic liner design and analysis tool 1 of the present invention includes a graphical user interface 5 including a 2-D drawing package 6, an input deck translator 8, and a 1-D impedance model 10. X-Y liner coordinates 12 are input utilizing the 2-D drawing package 6, and the analysis parameters 14 are input utilizing the graphic user interface 5. Liner channel geometry 16 and impedance and absorption spectra 18 are output by the tool 1. Although the software was developed in LabVIEW®, other programming environments may also be utilized.

Impedance prediction models have been developed to determine the impedance of cylindrical resonators that may be utilized in acoustic liners for turbo fan noise control applications. The Zwikker-Kosten Transmission Line (ZKTL) model is an example of a one dimensional transmission line model that has been developed. A correction for rectangular channels the ("Richards Correction") has also been developed to allow extension of the prediction model to account for slot resonators. Testing has shown that the presence of skew and/or sharp bends does not significantly alter the impedance of a slot resonator as compared to a straight resonator of the same total channel length (see e.g., "Howerton, B. M., Parrott, T. L., "Validation of an Acoustic Impedance Prediction Model for Skewed Resonators," AIAA2009-3143).

Figure 2:
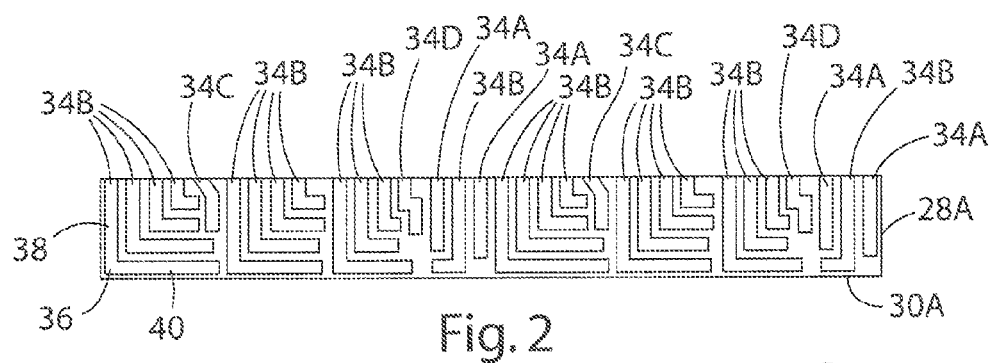
FIG. 2 is a drawing of an acoustic liner using bent channel resonators to reduce physical liner depth.
Figure 3:
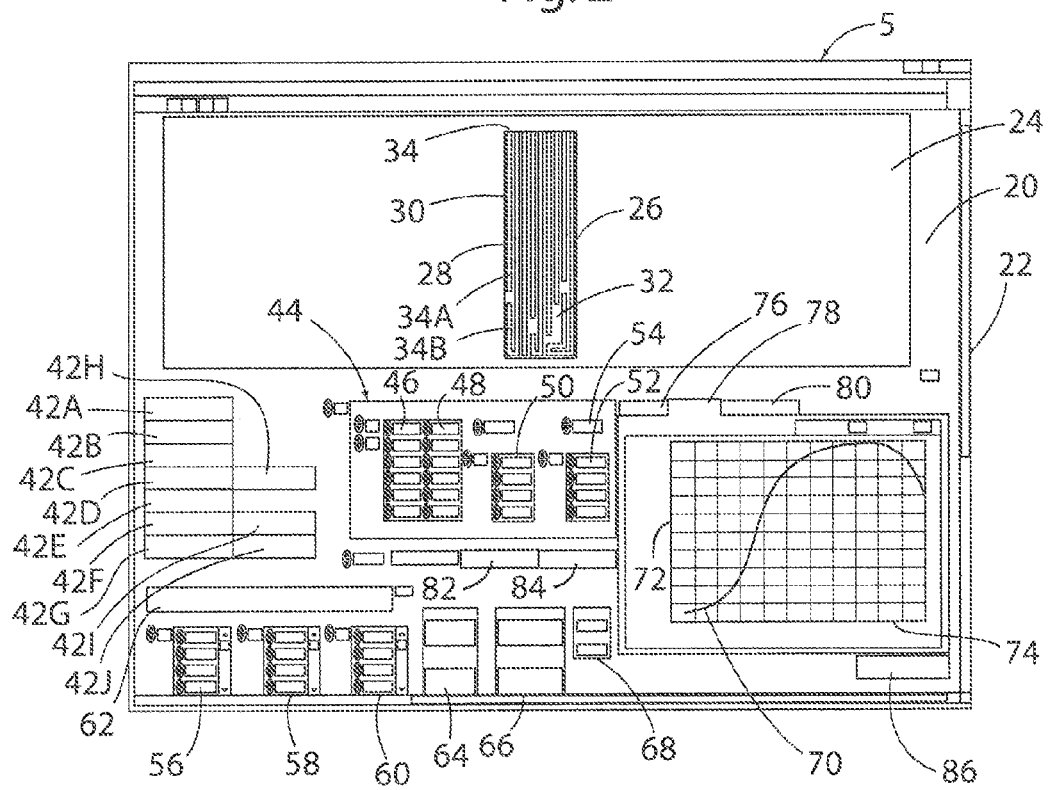
FIG. 3 shows a user interface of a display screen according to one aspect of the present invention.

With reference to FIGS. 2 and 3, software according to the present invention provides a graphical means to plot the design space (e.g. perimeter 30A of liner 28A) and, using the keyboard and/or mouse, draw in the liner resonator channels 34A-34D, etc. As discussed in more detail below, FIG. 3 is a screen shot of a user interface 5 where the upper area 24 displays the current liner geometry and design space. The code was written in LabVIEW® using a state-machine architecture that permits straightforward implementation of new features. Simple text files define the geometry of the design space while resonator channels 34A-34D, etc. are represented by an array of X and Y coordinates of their vertices (e.g. corner 36, FIG. 2) relative to the design space origin. As the vertices are defined, the code calculates segment lengths (based on the channel centerline) and average channel wall separation (the average of the distance between the two matching pairs of vertices that define a channel segment). Coordinate values for individual vertices can be entered or adjusted manually through numeric controls to precise locations, if required. Special functions allow the user to duplicate or spatially shift an existing channel or rotate a channel horizontally about its first vertex. Once a liner design is completed, it can be saved to a file for later recall. The resulting predicted normalized impedance spectra can be exported from the code directly into other analysis software or spreadsheets.

The impedance calculation may be coded as a separate subroutine to allow for future modeling improvements with minimal changes to the main program. The software automatically generates the input deck (i.e. liner geometry) for the impedance calculation and runs the impedance subroutine whenever the liner geometry is modified.

Figure 4:
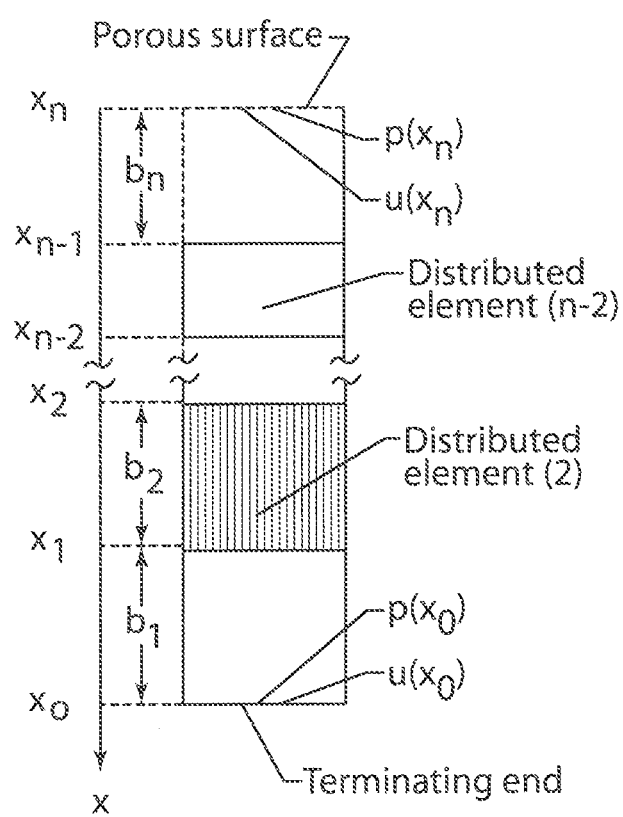
FIG. 4 shows a labeling scheme for elements in a single, isolated channel of a multi-channel resonator system that is amenable for a one dimensional wave guide propagation model.

The present invention may utilize a impedance prediction code that was previously developed. This code calculates surface impedance spectra for various liner configurations based on liner geometry and material properties. The basis for this code is described in T. L. Parrott; M. G. Jones: "Parrallel-element Liner Impedances for Improved Absorption of Broadband Sound in Ducts," Noise Control Engineering Journal, vol. 43~(6), November 1995, the entire contents of which are incorporated by reference. Liner geometries can be as simple as a single resonant channel. However, the code can evaluate arrays of channels, the effects of variable depth, as well as the addition of face sheets and imbedded septa. Thus, liners with single or multiple degrees of freedom can be analyzed. The surface impedance spectra of the individual chambers are combined to calculate the effective impedance of the liner sample. Computation of these values is achieved by first determining the acoustic admittance for each channel ($\beta_{ch}=1/\zeta_{ch}$). Individual channel admittances are calculated from a known Zwikker-Kosten transmission line model. The effective admittance at the liner surface can then be calculated by:

$$\beta_s = \Omega \sum_{i=1}^{N_{ch}} \beta_{ch}$$

Where $N_{ch}$ represents the number of liner chambers and $\Omega$ is the open area ratio of the liner surface (porosity). The liner's uniform, effective, surface impedance is computed using the relation $\zeta_s=1/\beta_s$. The impedance prediction code uses a transfer function format to calculate the admittance of an individual channel, potentially consisting of multiple elements, as indicated in FIG. 4 which shows the labeling scheme used to define such a multi-element channel. Wave transmission through a dissipative channel can be described by a forward transmission matrix of the following form:

$$\begin{pmatrix} p(x_{n+1}) \\ u(x_{n+1}) \end{pmatrix} = \begin{pmatrix} T_{11} & T_{12} \\ T_{21} & T_{22} \end{pmatrix} \begin{pmatrix} p(x_n) \\ u(x_n) \end{pmatrix}$$

where $T_{11}=T_{22}=\cos h(k\Gamma L)$, $T_{12}=\zeta_e \sin h(k\Gamma L)$, and $T_{21}=\zeta_c^{-1} \sin h(k\Gamma L)$ with $\Gamma$ as the propagation constant, $\zeta_c$ as the characteristic impedance, k as the free-space wave number and L as the channel depth. The terminating condition for each channel may comprise a non-rigid termination or a rigid, impervious boundary expressed in matrix form as:

$$\begin{pmatrix} p(x_0) \\ u(x_0) \end{pmatrix} = \begin{pmatrix} 1 \\ 0 \end{pmatrix}$$

The details of the impedance prediction code are known, such that these details will not be described in detail herein.

With further reference to FIG. 3, graphical user interface 5 generates an image 20 on a computer display screen 22. The drawing code 6 is based on the intrinsic 'picture functions' palette of tools and the 2-D picture control within LabVIEW®. The basic building block of a liner drawing is the line segment. All geometries may be defined as a series of vertices joined by these line segments. The design envelope, within which the resonator channels are drawn, is imported into the code as a list of sequential X and Y coordinate pairs where line segments are drawn between each successive X and Y coordinate pair. The line drawing is then displayed in the picture control (region 24, FIG. 3). A set of scaling functions handles the pixel-to-inches and inches-to-pixel conversions required to give the liner drawing proper 'real-world' dimensions. Slider bars around the border of the picture control shift the origin of the drawing and change the scaling (pixels/inch) to provide zoom and translation capability. Liner channels may be drawn one vertex at a time. The code uses LabVIEW® functions to tell the coordinates of the cursor within the picture control. A keystroke combination (<Shift>+<Space>) is used to tell the code to record the current cursor location as the start of a new channel. Further vertices are added using left mouse clicks to store the current cursor location. One feature or step involves defining the first vertex that marks the end of a channel. After starting a channel, pressing <Space> sets the most recent vertex as the channel end. Subsequent vertices are then considered part of the 'return leg' of the channel. Two pairs of neighboring vertices define a channel segment. Channel segment length and wall separation are computed geometrically and stored for use in the analysis portion of the software tool 1. Modifications to the coordinates of a vertex can be done manually using the front panel controls of the 'Channels' array of clusters (clusters are a LabVIEW® construct where data of differing types can be stored together). Additional features simplify the channel creation and manipulation process. These include channel duplication, translation and rotation features. These features are automated modifications of the vertex coordinates of a channel or channels coupled with a redraw of the configuration. An 'Undo' feature (discussed below) deletes the last vertex created and redraws the associated channel.

Referring again to FIG. 3, a first region 24 includes an image 26 of a liner 28 including a rectangular perimeter 30 defining a two-dimensional design space 32. In the illustrated example, the liner 28 includes a plurality of resonator channels 34. The resonator channels may comprise linear/straight channels 34A or skewed/bent channels 34B. For example, with further reference to FIG. 2, a liner 28A may include a rectangular perimeter 30A, and a plurality of linear resonator channels 34A. The liner 28A also includes a plurality of L-shaped resonator channels 34B, and a plurality of channels 34C having a bend that is between 0 and 90°. The liner 28A also includes resonator channels 34D that include two 90° bends. The liner may further include channels having bends in the range of 90 to 1800. Non-linear resonator channels include first and second linear portions 38 and 40 and a bend or vertex 36. It will be understood that the bends/vertices 36 may comprise "sharp" corners or curvilinear corners. In general, a liner may include resonator channels 34 having numerous geometric configurations and lengths.

Referring again to FIG. 3, graphical user interface 5 may include a plurality of input features 42A-42J. In the illustrated example, the input features comprise "Clear All" input feature 42A, "Read Coordinate File" input feature 42B, "Read Channel" file input feature 42C, "Shift a Channel" input feature 42D, "Duplicate a Channel" input feature 42E, "Redraw All" input feature 42F, "Undo Last Channel PT" input feature 42G, "Spin Channel 180" input feature 42H, "Store Channel File" input feature 42I, and "Create Image File" input feature 42J. Each of the input features 42A-42J can be actuated by clicking a front panel control button with the mouse.

The graphic user interface 5 also includes a region 44 with displays/input features 46 and 48 that can be utilized to enter the X and Y coordinates of the vertices of the channels. The graphical user interface 5 also includes a display/input 56 for input of frequencies, and a display/input 58 for input of air temperatures. A display/input feature 62 shows the location of a file to be saved or retrieved. Display features 64 and 66 show the picture-relative coordinates (pixels) and liner-relative coordinates (inches), respectively. A display 68 shows the coordinates of the liner origin.

The graphical user interface 5 may include a display 60 that shows calculated target path lengths. These lengths are calculated based on the desired frequencies and air temperatures. A user can thereby determine an approximate length of a resonator channel to absorb a specific frequency.

The graphical user interface 5 further includes an output display 70 in the form of a graph showing impedance or absorption on a vertical axis 72 and frequency on a horizontal axis 74. Tabs 76 and 78 permit a user to select between displaying impedance and absorption, respectively. A tab 80 permits a user to display analysis parameters on output display 70.

On/off input features 82 and 84 permit a user to display the number and lengths of channels and channel highlighting, respectively. If the channel highlighting feature 84 is "on", the resonator channels 34 are displayed in different colors. An exit feature 86 permits a user to exit the graphical user interface 5.

In use, a user draws a liner 28 and resonator channels 34 utilizing the various input features described above. As the resonator channels 34 are drawn, the output is automatically displayed on output display 70. Referring again to FIG. 1, the drawing code 6 is automatically input into the 1-D impedance model 10 by an input deck translator 8. The drawing code 6 can be utilized to change the geometry of the individual resonator channels 34 as shown on first region 24 (FIG. 3), and the output display 70 is automatically updated to reflect the new resonator channel geometry. Thus, the user can instantly see the effect of alterations to the configurations of the channels. In a predefined embodiment, the predicted impedances and display are automatically updated at the time new liner (channel) geometries are entered by a user. However, the code may include an additional "update calculated impedance" input feature that must be selected by a user to update the predicted impedance calculations and associated display.

Code according to one aspect of the present invention utilizes a two-dimensional "cross-sectional" representation of the liner and channels. Thus, a third dimension is not utilized in the inputs or outputs with respect to predicting impedance of the liner. However, it will be understood that the code may be configured to include a third dimension to take into account the effects of a third dimension. Also, although the channels of FIGS. 2 and 3 have substantially uniform cross sectional areas and shapes, the code may be configured to provide for input and analysis of channel geometries that have non-uniform cross-sectional sizes and/or shapes. Still further, the channels may have almost any cross-sectional shape. For example, the channels may have circular or oval cross-sectional shapes, rectangular cross-section shapes, etc.

The method and code of the present invention takes advantage of advanced manufacturing techniques that allow acoustic liners to be customized such that the surface impedance of each individual cell of the liner is independently controlled. Liners can also be packaged with skew and/or bends to better fit within the confines of the available liner space. The real-time analysis of liner geometries allows for liners to be designed to target a specific acoustic impedance spectrum. In this way, liners can be designed to provide acceptable sound absorption while being packaged within confined or irregularly shaped spaces.

It is also to be understood that variations and modifications can be made on the aforementioned structures and methods without departing from the concepts of the present invention, and further it is to be understood that such concepts are intended to be covered by the following claims unless these claims by their language expressly state otherwise. Moreover, any references mentioned herein and not specifically incorporated by reference are hereby incorporated into the present application by reference.

What is claimed is:

1. A method of designing acoustic liners for reducing turbofan engine noise of an aircraft, the method comprising utilizing software to design arrays of resonator channels that are packaged into complex geometries and to design and analyze acoustic liners for portions of a turbofan engine previously unused:
    utilizing input data to produce a drawing image that is viewed on a display screen;
    forming an image representing an acoustic liner on a display screen, the image including a plurality of resonator channels having channel geometries; wherein at least one of the resonator channels includes at least two substantially linear segments that are joined by a bend defining a vertex; wherein upon defining the vertex, calculating segment lengths and average channel wall separation;
    utilizing input data related to the channel geometries to calculate predicted acoustic impedance and absorption of noise by the resonator channels while evaluating arrays of channels and individually controlling the surface impedance of each individual channel;
    calculating output data relating to predicted acoustic impedance and absorption of noise by the acoustic liner, wherein an image is displayed representing predicted acoustic impedance and absorption of noise by the acoustic liner; and wherein:
    the predicted acoustic impedance and absorption of noise utilizes a one dimensional transmission line mathematical model, and the aircraft turbofan engine acoustic liner provides broadband sound absorption in spaces previously unused and unsuitable for acoustic liners due to the geometric complexities of available space, and the image representing predicted acoustic impedance and absorption of noise is changed and updated in real time upon changing the geometry of at least a selected one of the geometry of the resonator channels.

2. The method of claim 1, wherein:
    the resonator channel has a rectangular cross sectional shape;
    the impedance prediction code accounts for the rectangular cross sectional shape in calculating output data.

3. The method of claim 2, wherein:
    the resonator channel includes first and second sections that are substantially linear, and a bend of at least about ninety degrees interconnecting the first and second sections such that the first and second sections are disposed at an angle of at least about ninety degrees relative to each other.

4. The method of claim 3, wherein:
    the first and second sections define lengths and have substantially identical cross sectional shapes with substantially uniform cross sectional areas along the lengths of the first and second sections.

5. The method of claim 1, wherein:
    the code includes drawing code that utilizes drawing data to generate drawing images, and impedance prediction code, and wherein the code translates drawing data from the drawings code and inputs the translated drawing data into the impedance prediction code whereby the impedance prediction code recalculates predicted impedance when the geometry of the resonator channel is changed.

6. The method of claim 5, wherein:
    the code generates a graphical user interface feature on a display screen that can be selected by a user to cause the impedance prediction code to recalculate predicted impedance utilizing newly-entered drawing data.

7. The method of claim 1, wherein:
    the image representing predicted absorption of noise comprises a graph with predicted acoustic absorption and/or predicted acoustic impedance on a first axis and a frequency on a second axis.

8. The method of claim 1, wherein:
    the one resonator channel is represented by first and second coordinates defining the location of the vertex relative to the design space origin.

9. The method of claim 8, wherein:
    each resonator channel defines a centerline; and:
    calculating lengths of the substantially linear segments utilizing data defining centerlines of the resonator channels.

10. The method of claim 9, including:
    calculating an average channel wall separation for each substantially linear channel segment, wherein the average channel wall separation comprises an average distance between two matching pairs of vertices defining a substantially linear channel segment.

11. The method of claim 8, wherein:
    inputting first and second coordinates defining the vertices.

12. The method of claim 8, further comprising:
    duplicating a channel.

13. The method of claim 12, further comprising:
    moving a resonator channel.

14. A method of predicting impedance of a structure in real time as a geometry of the structure is changed in order to reduce turbofan engine noise of an aircraft, the method comprising utilizing software to predict arrays of resonator channels that are packaged into complex geometries and to predict the impedance of acoustic liners for portions of a turbofan engine that were previously unused, the method including the steps of:
    generating a first image of the structure upon entry of image data, wherein the structure includes at least one resonator channel defining a first channel geometry;
    predicting an impedance of the structure utilizing the first channel geometry;
    displaying the predicted impedance while individually controlling surface impedance of each individual channel;
    changing the first image into a second image by entering revised image data, the second image including at least one resonator channel having a second channel geometry that is not identical to the first channel geometry;
    predicting a revised impedance utilizing the second channel geometry, and automatically predicting a revised impedance upon entry of the revised image data;

wherein the predicted acoustic impedance utilizes a one dimensional transmission line mathematical model, and the aircraft turbofan acoustical engine acoustic liner provides broadband sound absorption in spaced previously unused and unsuitable for acoustic liners due to the geometric complexities of available space; and displaying the predicted impedance determined utilizing the second channel geometry; wherein the image representing predicted acoustical impedance is changed and updated in real time upon changing the geometry of at least a selected one of the geometry of the resonator channels.

15. The method of claim 14, wherein:
the resonator channel has a rectangular cross sectional shape.

16. The method of claim 15, wherein:
the resonator channel includes at least two substantially linear sections that are joined at a vertex, and wherein the two substantially linear sections form an angle of at least about ninety degrees relative to one another.

17. The method of claim 14, wherein:
entering revised image data includes entering data to form a second resonator channel having the second channel geometry.

18. The method of claim 14, wherein:
entering revised in data includes entering data to change the channel geometry of the at least one channel geometry from the first channel geometry to the second channel geometry.

* * * * *